(12) United States Patent
Lo et al.

(10) Patent No.: US 10,879,119 B2
(45) Date of Patent: Dec. 29, 2020

(54) METHOD FOR FABRICATING A SEMICONDUCTOR DEVICE

(71) Applicant: TAIWAN SEMICONDUCTOR MANUFACTURING CO., LTD., Hsinchu (TW)

(72) Inventors: Yuan-Yen Lo, Taipei (TW); Chia-Cheng Chang, Hsinchu County (TW); Ming-Jhih Kuo, Zhubei (TW); Chien-Yuan Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/552,727

(22) Filed: Aug. 27, 2019

(65) Prior Publication Data
US 2020/0105596 A1 Apr. 2, 2020

Related U.S. Application Data

(60) Provisional application No. 62/738,875, filed on Sep. 28, 2018.

(51) Int. Cl.
| H01L 21/768 | (2006.01) |
| H01L 21/8238 | (2006.01) |
| H01L 21/285 | (2006.01) |
| H01L 21/32 | (2006.01) |

(52) U.S. Cl.
CPC .. *H01L 21/76895* (2013.01); *H01L 21/28518* (2013.01); *H01L 21/32* (2013.01); *H01L 21/76805* (2013.01); *H01L 21/76816* (2013.01); *H01L 21/823821* (2013.01); *H01L 21/823871* (2013.01)

(58) Field of Classification Search
CPC .............. H01L 21/76895; H01L 21/823871
See application file for complete search history.

(56) References Cited

U.S. PATENT DOCUMENTS

| 2016/0027703 A1* | 1/2016 | Do ................. H01L 27/092 257/369 |
| 2018/0157781 A1* | 6/2018 | Rastogi ............ H01L 21/76838 |

\* cited by examiner

*Primary Examiner* — Farun Lu
(74) *Attorney, Agent, or Firm* — McDermott Will & Emery LLP

(57) ABSTRACT

In a method of manufacturing a semiconductor device, initial connection patterns are prepared, initial cutting patterns for cutting the initial connection patterns are prepared, non-functional connection patterns at least from the initial connection patterns are identified, final cutting patterns are prepared from the initial cutting patterns and the non-functional connection patterns, a photo mask is prepared from the final cutting patterns, a photo resist pattern is formed over a target layer by a lithography operation using the photo mask, the target layer is patterned to form openings in the target layer by using the photo resist pattern, and connection layers are formed by filling the openings with a conductive material.

20 Claims, 13 Drawing Sheets

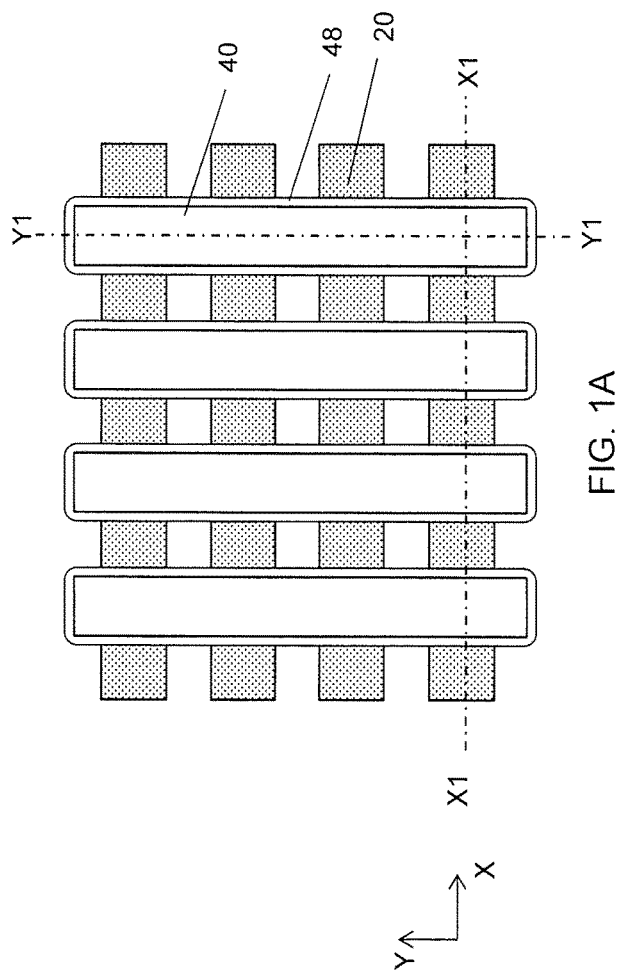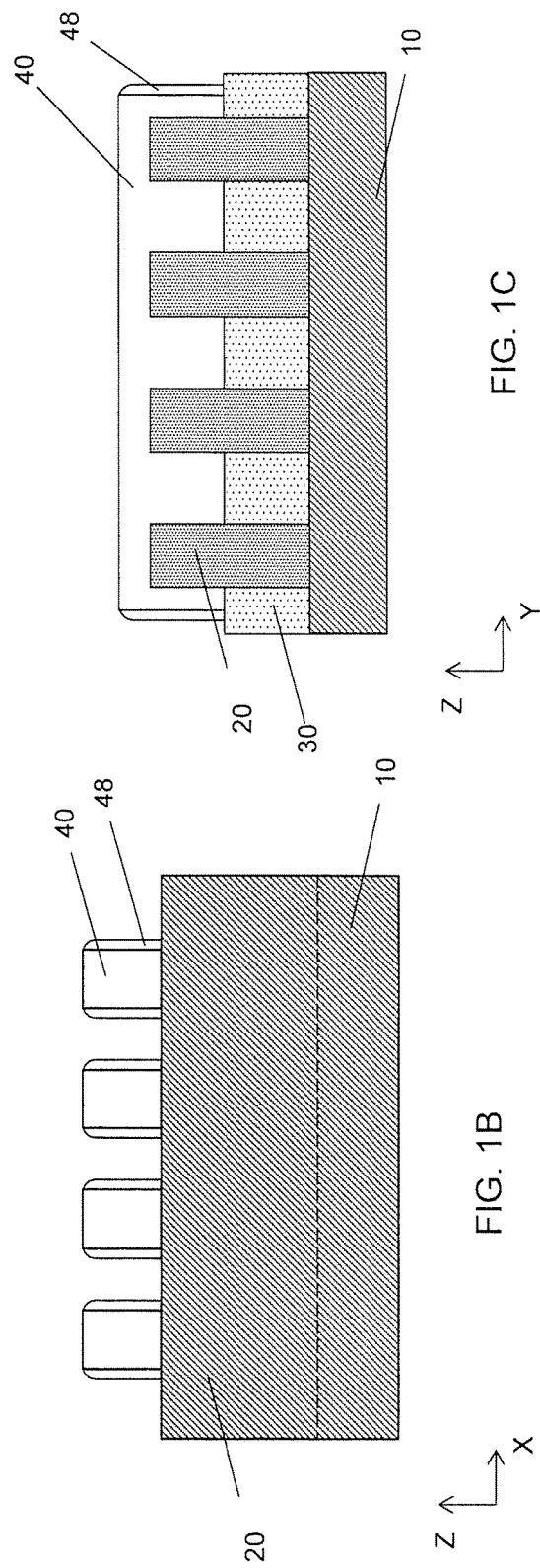

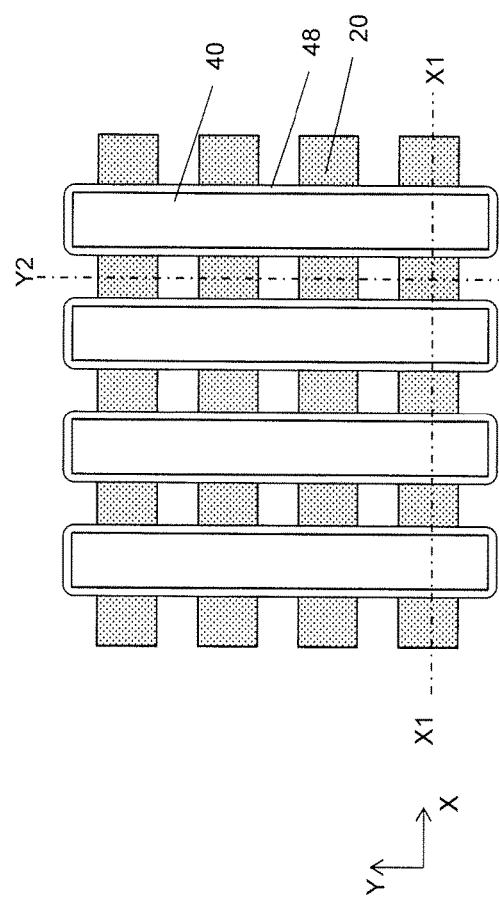
FIG. 2A
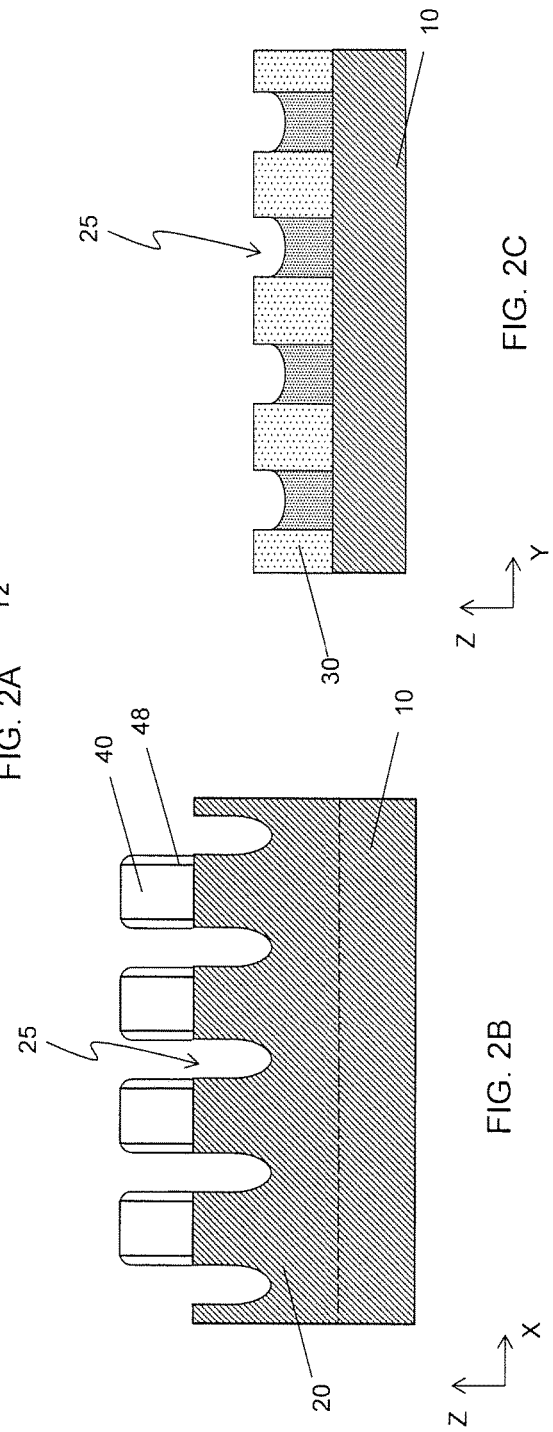
FIG. 2B
FIG. 2C

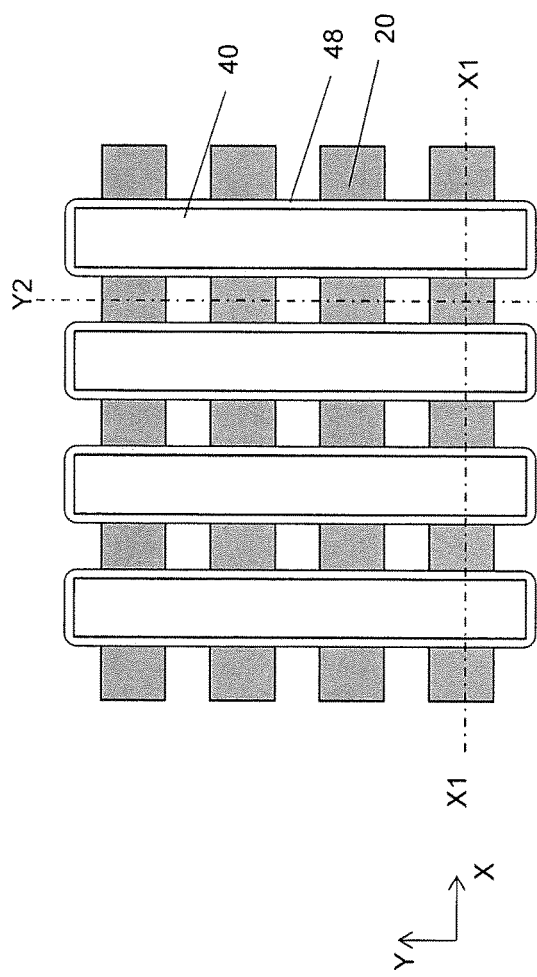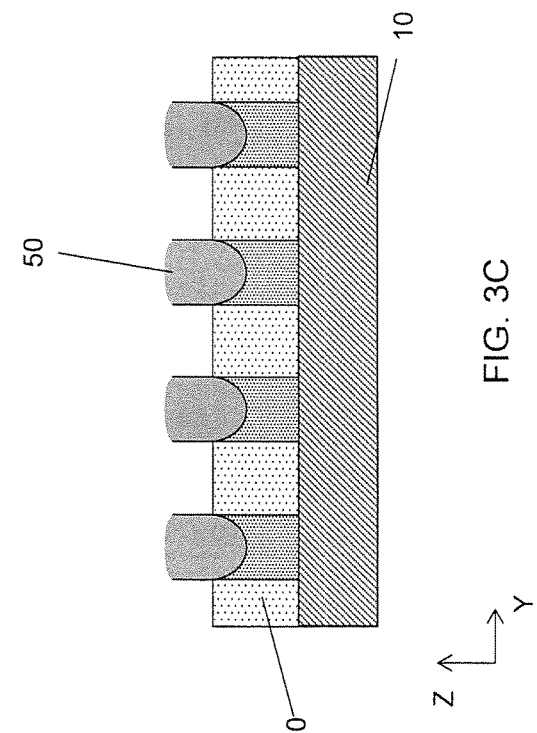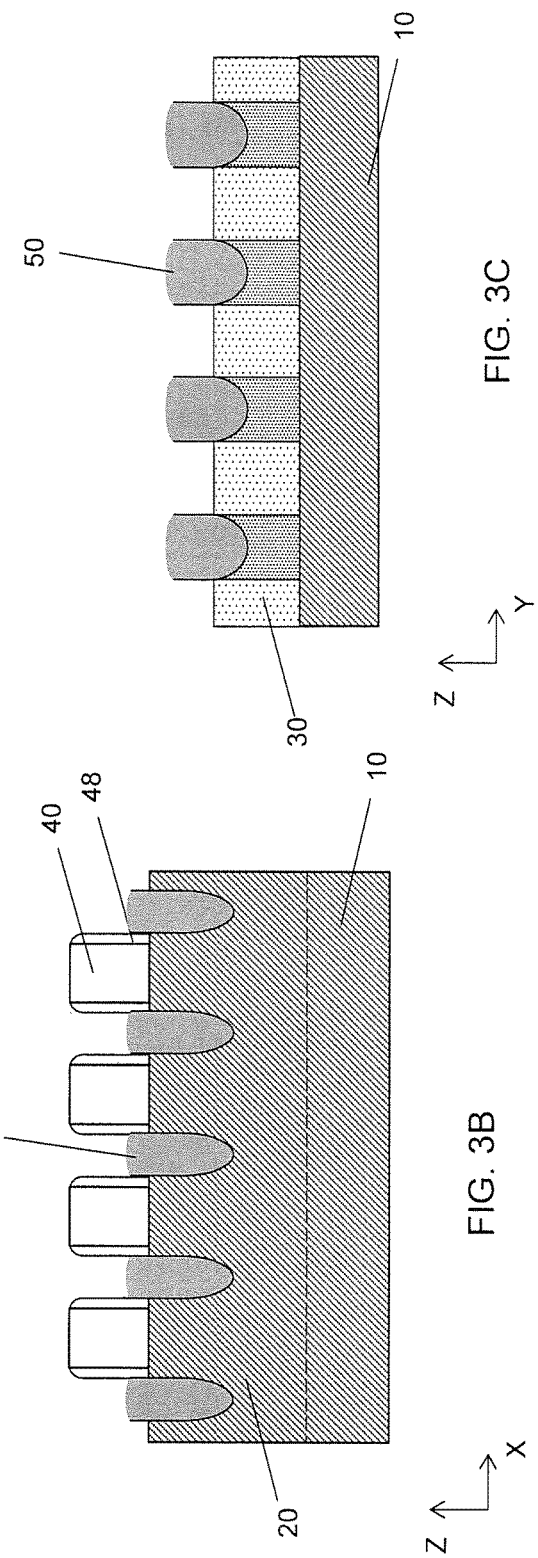

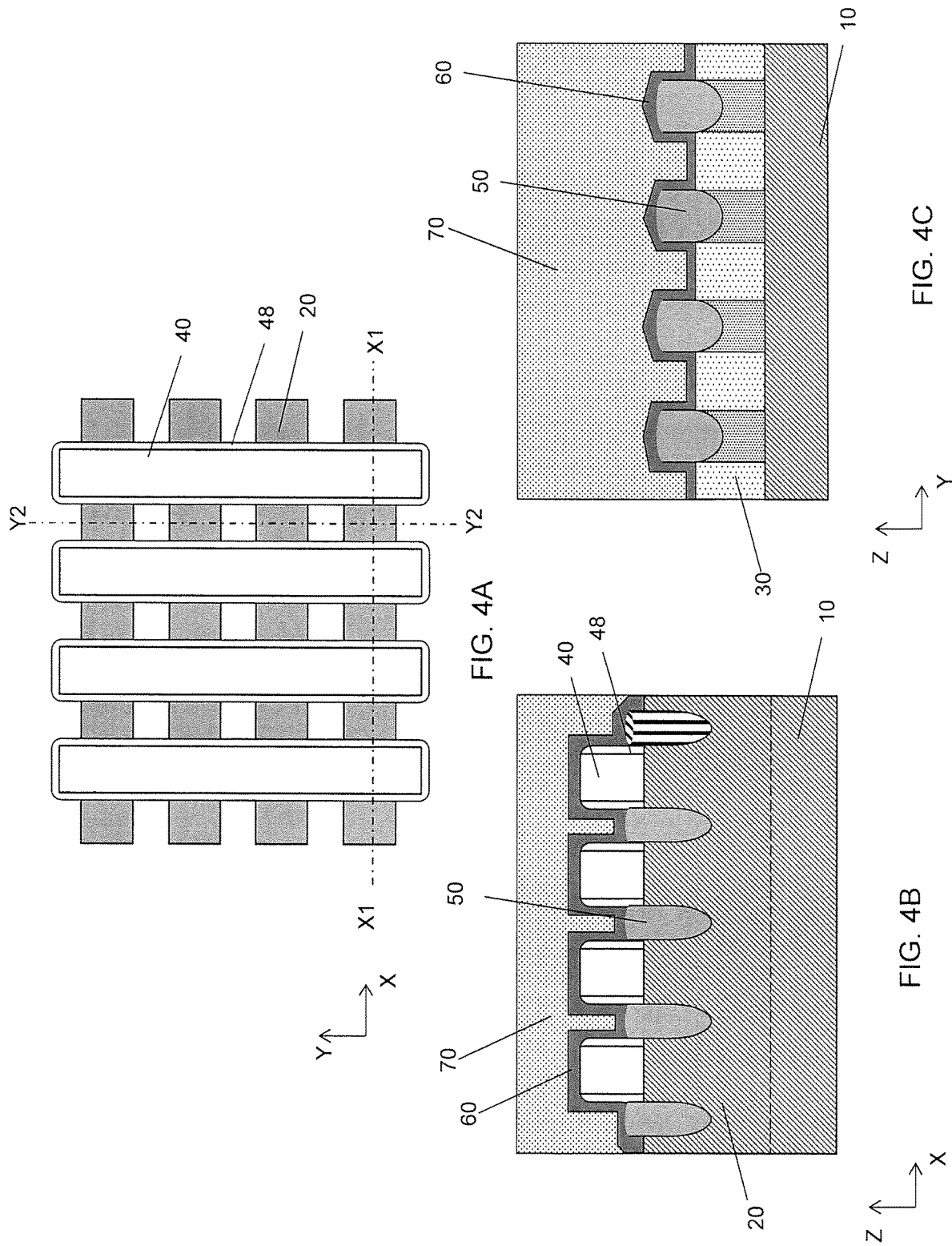

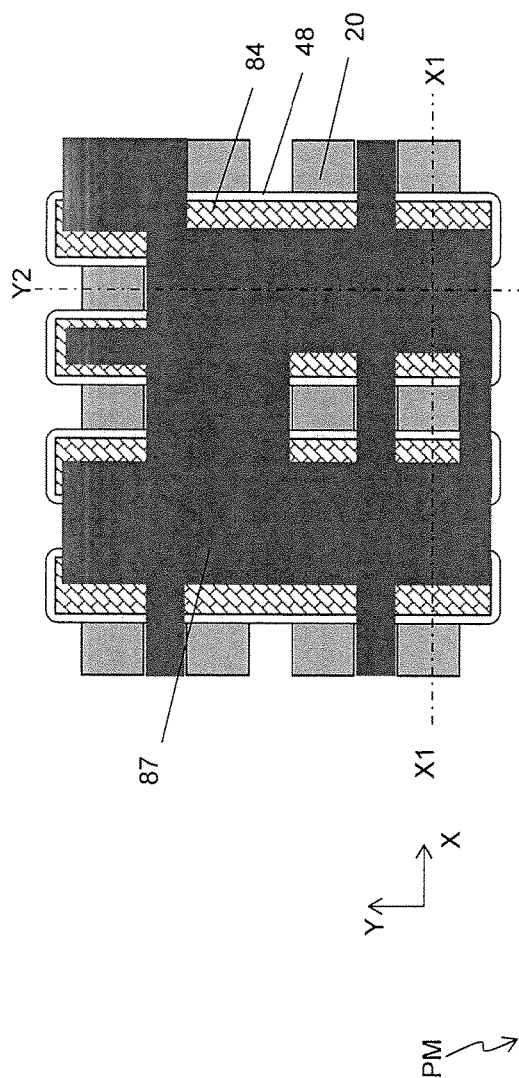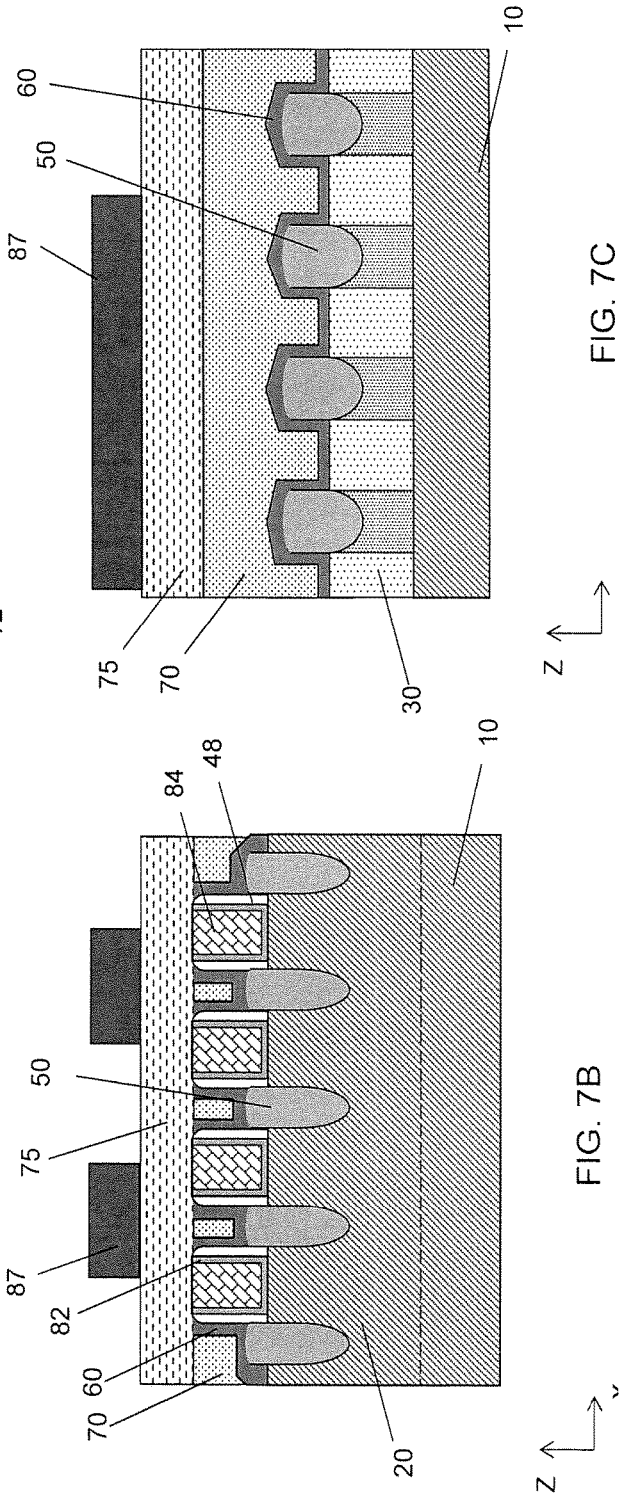

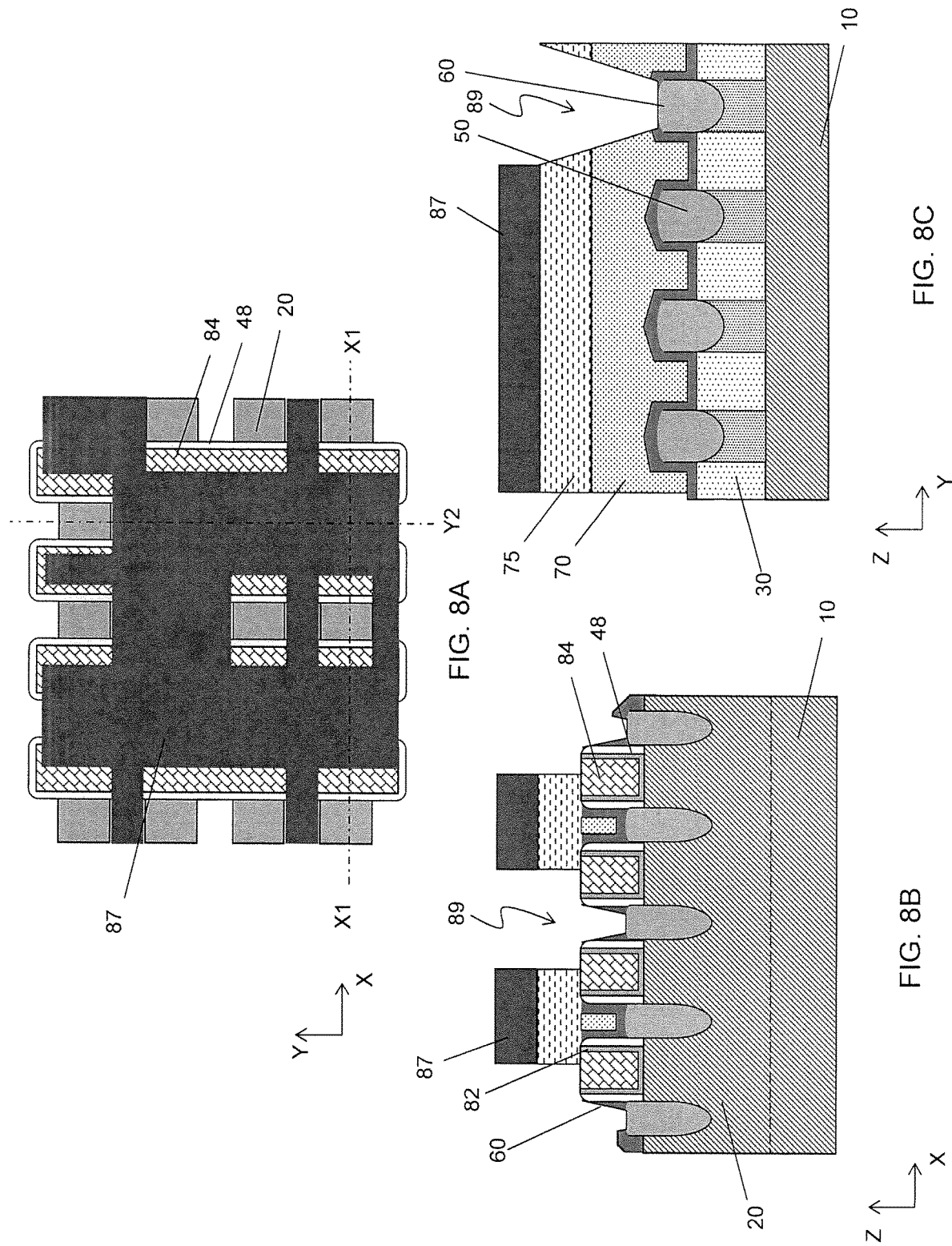

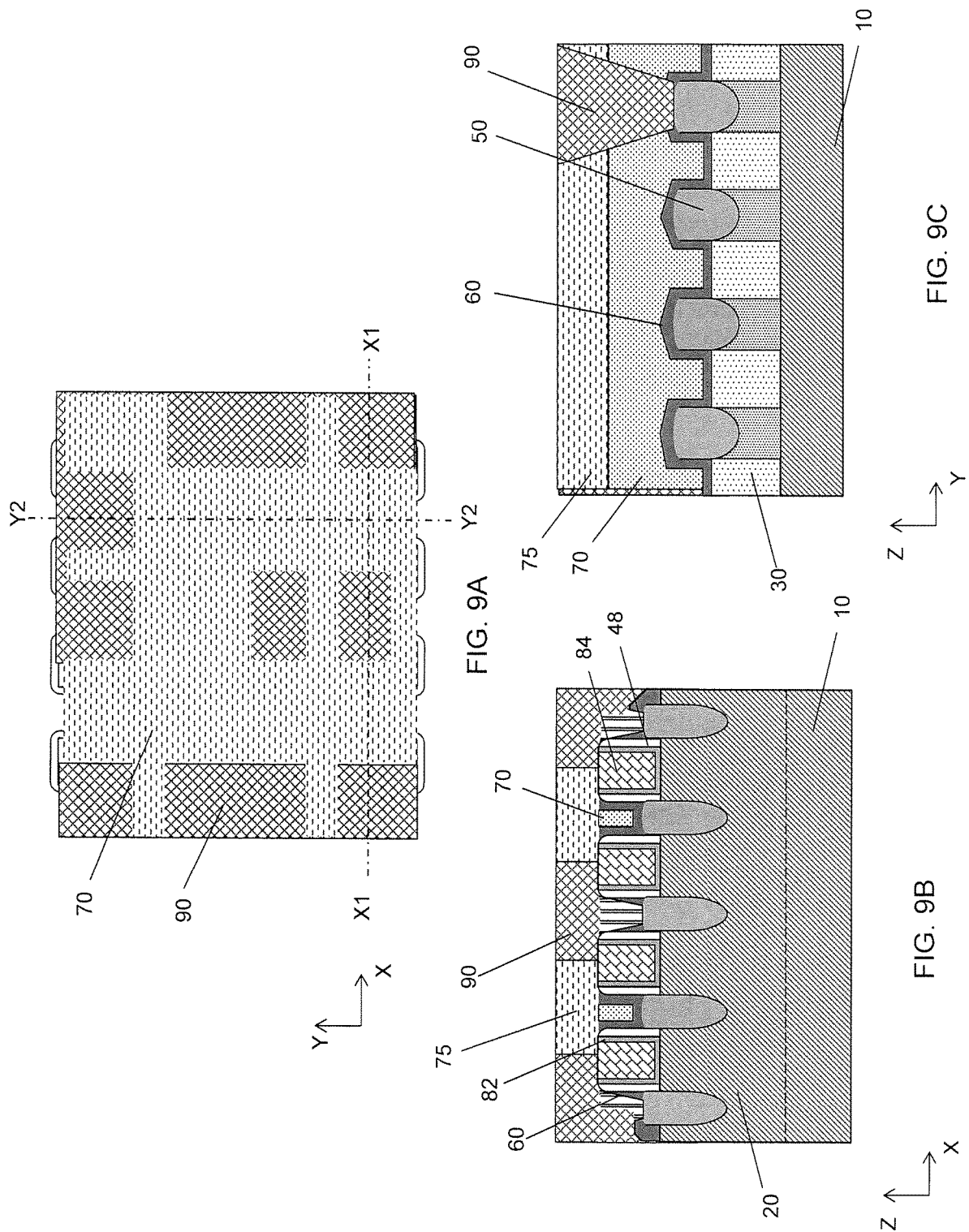

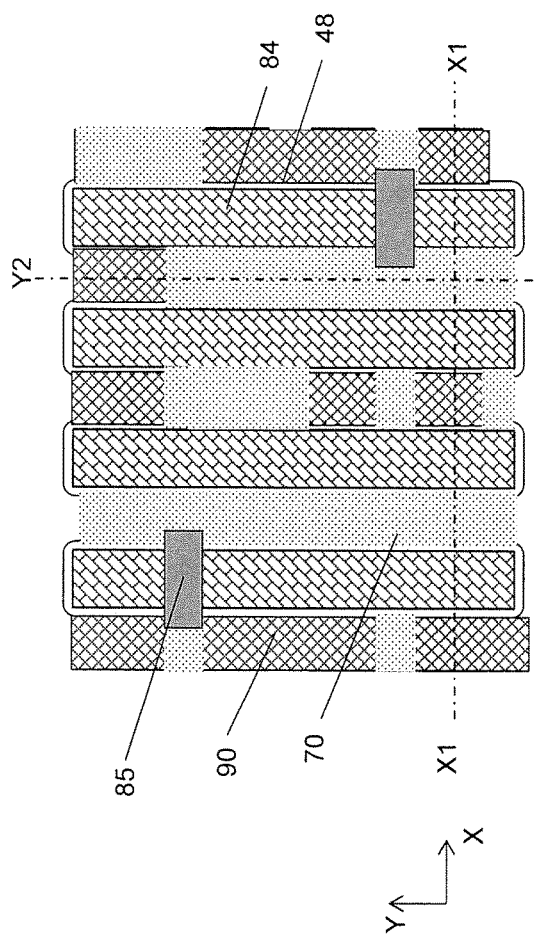
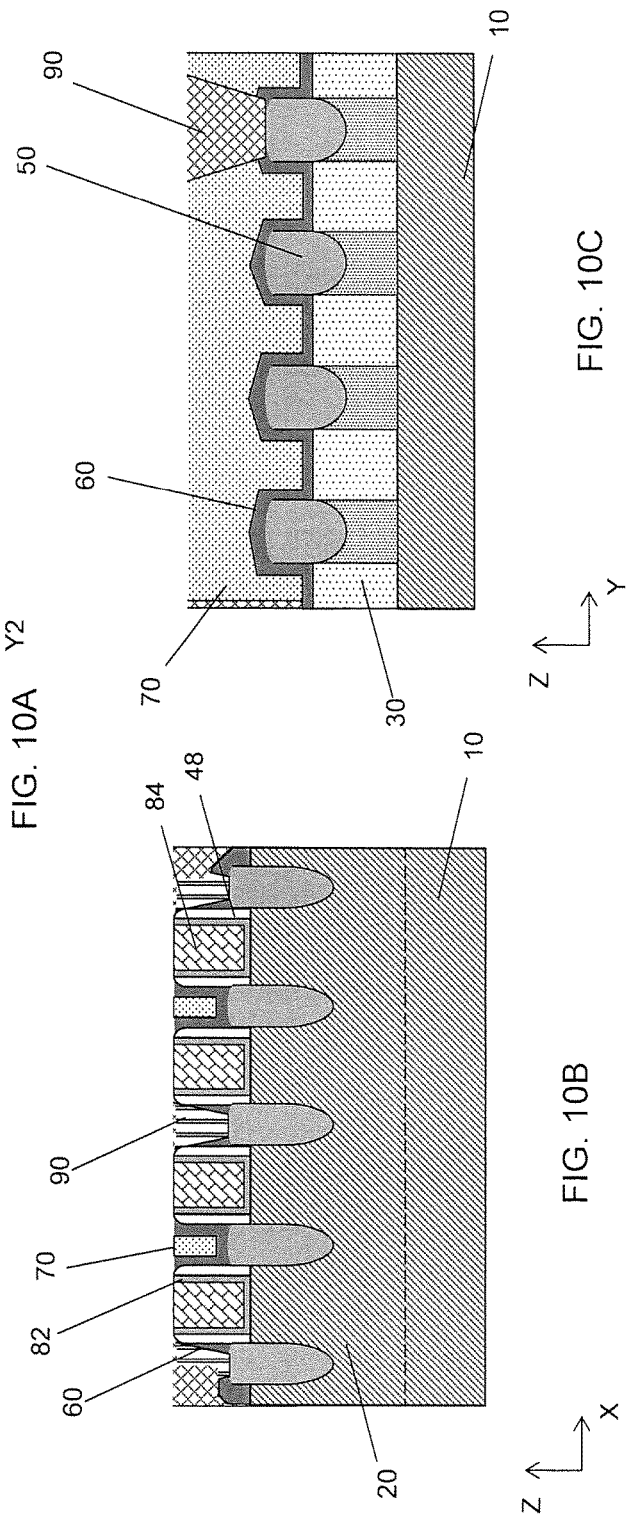
FIG. 10A
FIG. 10B
FIG. 10C

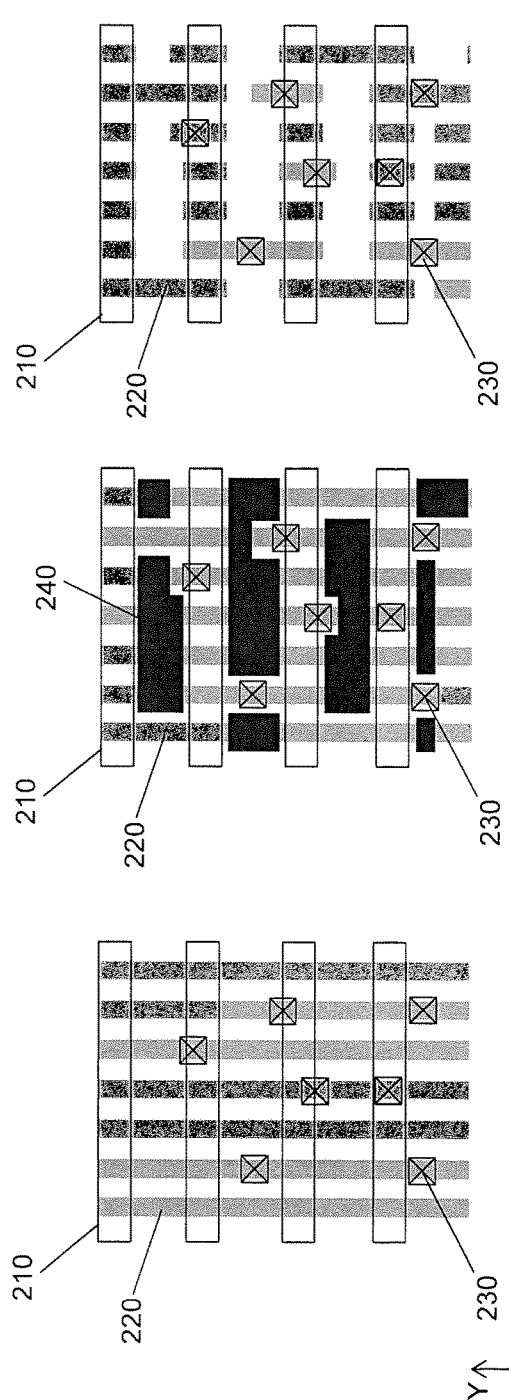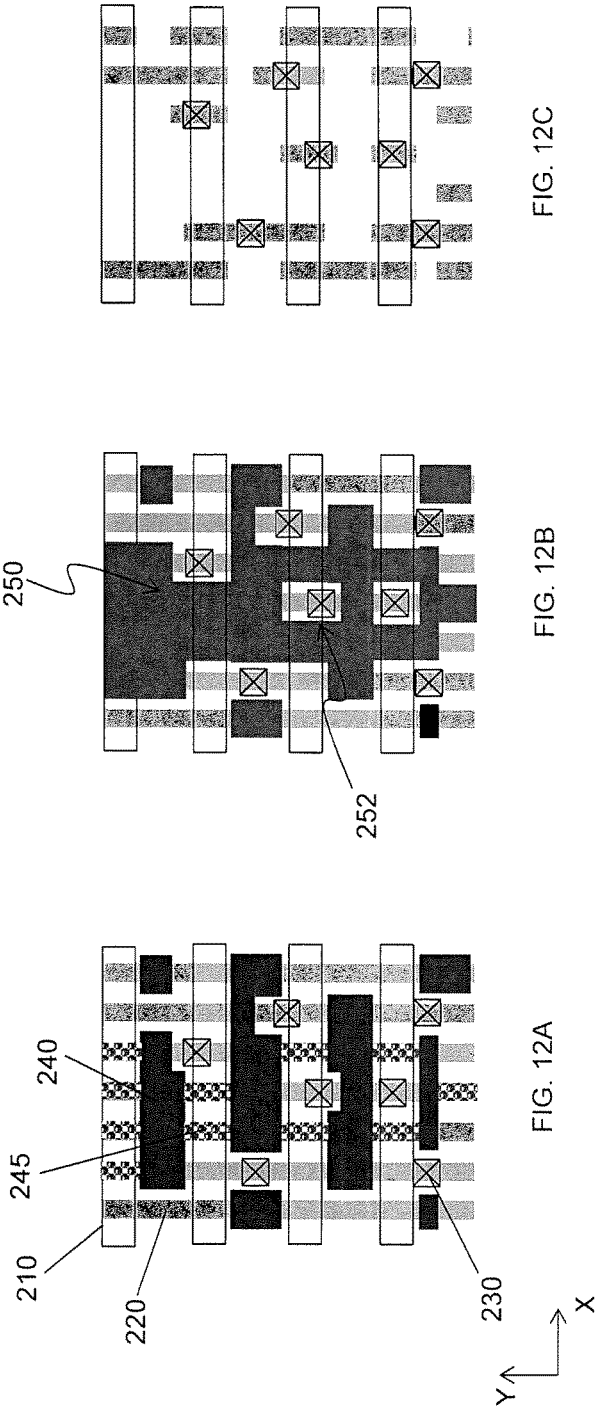
FIG. 11A FIG. 11B FIG. 11C FIG. 12A FIG. 12B FIG. 12C

METHOD FOR FABRICATING A SEMICONDUCTOR DEVICE

RELATED APPLICATION

The present application claims priority to U.S. Provisional Patent Application No. 62/738,875 filed on Sep. 28, 2018, the entire contents of are incorporated herein by reference.

BACKGROUND

With a decrease of dimensions of semiconductor devices with a complex layout structure, a local interconnect that connects a source/drain region to another source/drain region has been developed. A local interconnect or a diffusion contact is a conductive layer disposed on a source/drain region (e.g., source/drain epitaxial layer) below the first metal wiring layer, and connects elements having a relatively short distance and to gain a height of the source/drain region to be electrically connected to the first metal wirings. In designing standard cells, local interconnects enhance design flexibility and minimize the size of the standard cells. It has been required to provide structures and manufacturing processes for a local interconnect for more design flexibility and higher reliability.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B and 1C show a plan view (a top view), a cross sectional view along the X direction and a cross sectional view along the Y direction, respectively, illustrating one of the stages of a sequential semiconductor device fabrication process of according to an embodiment of the present disclosure.

FIGS. 2A, 2B and 2C show a plan view (a top view), a cross sectional view along the X direction and a cross sectional view along the Y direction, respectively, illustrating one of the stages of a sequential semiconductor device fabrication process of according to an embodiment of the present disclosure.

FIGS. 3A, 3B and 3C show a plan view (a top view), a cross sectional view along the X direction and a cross sectional view along the Y direction, respectively, illustrating one of the stages of a sequential semiconductor device fabrication process of according to an embodiment of the present disclosure.

FIGS. 4A, 4B and 4C show a plan view (a top view), a cross sectional view along the X direction and a cross sectional view along the Y direction, respectively, illustrating one of the stages of a sequential semiconductor device fabrication process of according to an embodiment of the present disclosure.

FIGS. 7A, 7B and 7C show a plan view (a top view), a cross sectional view along the X direction and a cross sectional view along the Y direction, respectively, illustrating one of the stages of a sequential semiconductor device fabrication process of according to an embodiment of the present disclosure.

FIGS. 8A, 8B and 8C show a plan view (a top view), a cross sectional view along the X direction and a cross sectional view along the Y direction, respectively, illustrating one of the stages of a sequential semiconductor device fabrication process of according to an embodiment of the present disclosure.

FIGS. 9A, 9B and 9C show a plan view (a top view), a cross sectional view along the X direction and a cross sectional view along the Y direction, respectively, illustrating one of the stages of a sequential semiconductor device fabrication process of according to an embodiment of the present disclosure.

FIGS. 10A, 10B and 10C show a plan view (a top view), a cross sectional view along the X direction and a cross sectional view along the Y direction, respectively, illustrating one of the stages of a sequential semiconductor device fabrication process of according to an embodiment of the present disclosure.

FIGS. 11A, 11B and 11C show layouts of local interconnect patterns.

FIGS. 12A, 12B and 12C show layouts of local interconnect patterns.

DETAILED DESCRIPTION

Figures 5A, 5B, 5C:
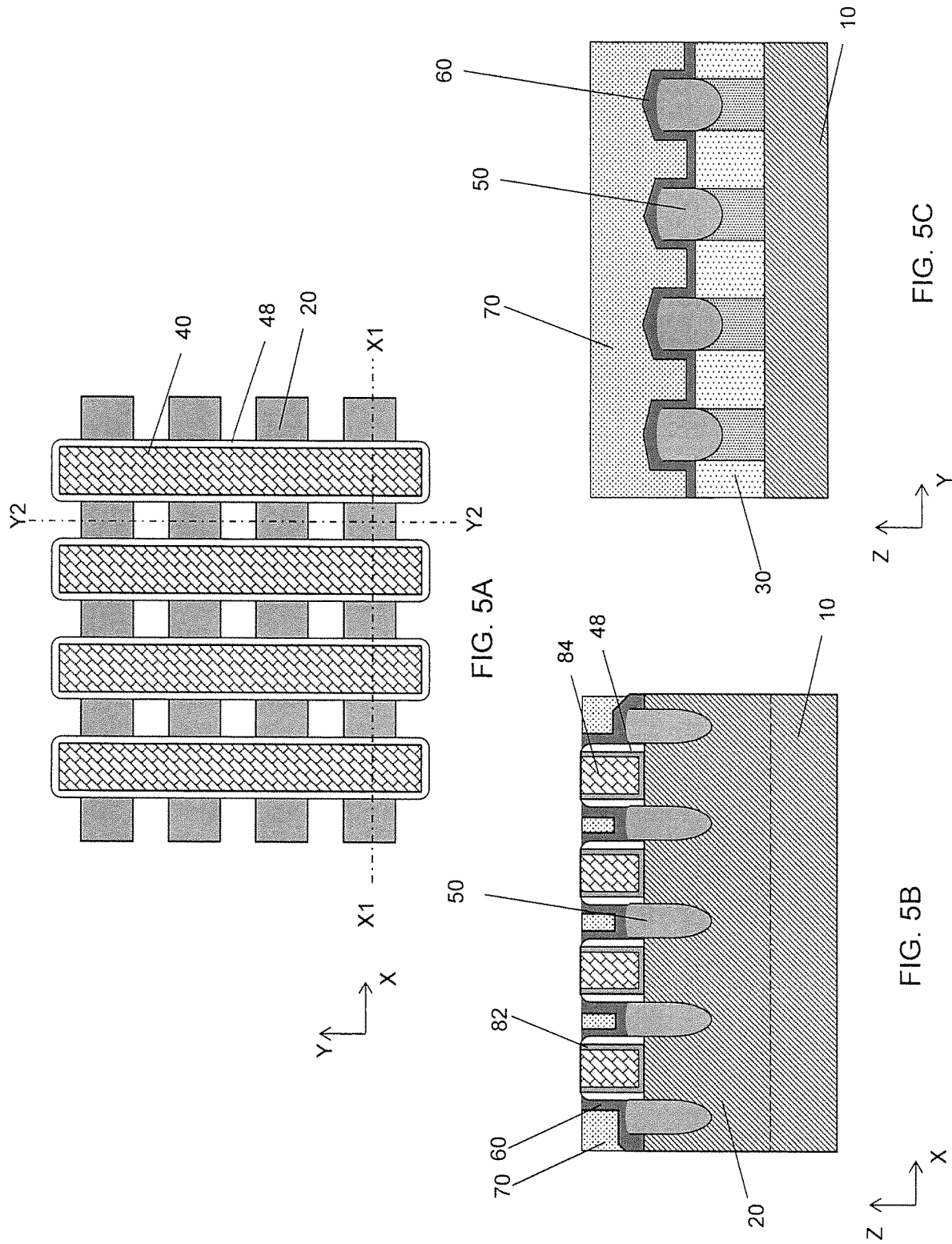
FIGS. 5A, 5B and 5C show a plan view (a top view), a cross sectional view along the X direction and a cross sectional view along the Y direction, respectively, illustrating one of the stages of a sequential semiconductor device fabrication process of according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

A semiconductor device includes transistors having a gate disposed over a channel region and a source region and a drain region (source/drain region) and one or more conductive wiring layers formed in one or more interlayer dielectric layers. In some embodiments, the channel region is a part of a fin structure protruding from an isolation insulating layer. A local interconnect, which may also be referred to as a diffusion contact, is a conductive (e.g., metal) layer connecting two or more source/drain regions (e.g., source/drain epitaxial layer) below the first (lowest) metal wiring layer. The local interconnects are disposed at the same level as the gate electrode layer. The local interconnect is also used to increase the height of the source/drain regions to be electrically connected to the first metal wirings. In such a case, the local interconnect does not necessarily connect two or more source/drain regions, and is disposed on one source/drain region. A via is further disposed on the local interconnect. As set forth above, the local interconnects are located near the gate electrodes, and thus the coupling effect between two conductive elements may affect device performance (e.g., speed).

In some embodiments, plurality of line-shaped conductive layers are formed between adjacent gate electrodes and a cutting operation is performed to cut the line-shaped conductive layers into multiple local interconnects, by removing part of the line-shaped conductive layers. In other embodiments, a plurality of grooves corresponding to the local interconnects are formed between adjacent gate electrodes, and the grooves are filled with conductive material.

In some cases, there are some non-functional local interconnects, called dummy local interconnects, existing in circuits that may cause a net capacitance increase, and degrade device performance. Removing the dummy local interconnects may require an additional patterning operation, which increases the manufacturing cost.

In the present disclosure, a novel manufacturing operation to form local interconnects is described.

FIGS. 1A to 10 show various views illustrating a sequential fabrication process of a semiconductor device according to an embodiment of the present disclosure. In these figures, some layers/features are omitted for simplification. It is understood that additional operations can be provided before, during, and after processes shown by these figures, and some of the operations described below can be replaced or eliminated, for additional embodiments of the method. The order of the operations/processes may be interchangeable.

FIGS. 1A-1C show one of the stages of a sequential fabrication process of a semiconductor device according to an embodiment of the present disclosure. FIG. 1A shows a plan (top) view, FIG. 1B shows a cross sectional view along line X1-X1 of FIG. 1A and FIG. 1C shows a cross sectional view along Y1-Y1 of FIG. 1A.

As shown in FIGS. 1A and 1B, fin structures 20, as active regions, are disposed over a substrate 10, and separated by an isolation insulating layer (shallow trench isolation (STI)) 30. In some embodiment, the fin structures 20 includes one or more fin structures for n-type fin field effect transistor transistors (Fin FETs) and one or more fin structures for p-type Fin FETs. The substrate 10 is, for example, a p-type silicon substrate with an impurity concentration in a range from about $1\times10^{15}$ cm$^{-3}$ to about $1\times10^{18}$ cm$^{-3}$. In other embodiments, the substrate is an n-type silicon substrate with an impurity concentration in a range from about $1\times10^{15}$ cm$^{-3}$ to about $1\times10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on insulator) substrate.

In some embodiments, the fin structures 20 are patterned by any suitable method. For example, the fin structures 20 can be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures.

The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of spin-on-glass (SOG), SiO, SiON, SiOCN and/or fluoride-doped silicate glass (FSG) in some embodiments. After forming a thick isolation insulating layer over the fin structures 20, a planarization operation is performed so as to remove part of the isolation insulating layer. The planarization operation may include a chemical mechanical polishing (CMP) and/or an etch-back process. Then, the isolation insulating layer is further removed so that an upper part of the fin structure 20, which is to become a channel layer, is exposed, as shown in FIG. 1C. In certain embodiments, the partial removing of the isolation insulating layer 30 can be performed using a wet etching process, for example, by dipping the substrate in hydrofluoric acid (HF). In another embodiment, the partial removing of the isolation insulating layer 30 can be performed using a dry etching process. For example, a dry etching process using $CHF_3$ or $BF_3$ as etching gases may be used. After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Then, a dummy gate structure 40 is formed over part of the fin structures 20 as shown in FIGS. 1A-1C. A dielectric layer and a poly silicon layer are formed over the isolation insulating layer 30 and the exposed fin structures 20, and then patterning operations are performed so as to obtain a dummy gate structure including a dummy gate electrode layer made of poly silicon and a dummy gate dielectric layer. The patterning of the poly silicon layer is performed by using a hard mask including a silicon nitride layer and an oxide layer in some embodiments. The dummy gate dielectric layer can be silicon oxide formed by CVD, PVD, ALD, e-beam evaporation, or other suitable process. In some embodiments, the dummy gate dielectric layer includes one or more layers of silicon oxide, silicon nitride, silicon oxy-nitride, or high-k dielectrics. In some embodiments, a thickness of the dummy gate dielectric layer is in a range of about 1 nm to about 5 nm. In some embodiments, the dummy gate electrode layer is doped polysilicon with uniform or non-uniform doping. In the present embodiment, the width of the dummy gate electrode layer is in the range of about 30 nm to about 60 nm. In some embodiments, a thickness of the dummy gate electrode layer is in a range of about 30 nm to about 50 nm. In addition, one or more dummy gate structures may be disposed adjacent to both sides of the dummy gate structure 40 to improve pattern fidelity in patterning processes. The width of the dummy gate structure 40 is in a range of about 5 nm to about 40 nm in some embodiments, and is in a range of about 7 nm to about 15 nm in certain embodiments.

Further, as shown in FIGS. 1A-1C, sidewall spacers 48 are formed on opposite side faces of the dummy gate structures 40. An insulating material layer for sidewall spacers 48 is formed over the dummy gate structure 40. The insulating material layer is deposited in a conformal manner so that it is formed to have substantially equal thicknesses on vertical surfaces, such as the sidewalls, horizontal surfaces, and the top of the dummy gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, bottom portions of the insulating material layer are removed by anisotropic etching, thereby forming sidewall spacers 48. In some embodiments, the sidewall spacers 46 include two to four layers of different insulating materials. In some embodiments, part of the dummy gate dielectric layer is disposed between the sidewall spacers 48 and the isolation insulating layer 30. In other embodiments, no part of the dummy gate dielectric layer is disposed between the sidewall spacers 46 and the isolation insulating layer 30.

In FIGS. 1A-1C, four fin structures 20 and four dummy gate structures are shown. However, the numbers of the fin structures 20 and the dummy gate structures are not limited to four, respectively.

FIGS. 2A-2C show one of the stages of a sequential fabrication process of a semiconductor device according to an embodiment of the present disclosure. FIG. 2A shows a plan (top) view, FIG. 2B shows a cross sectional view along line X1-X1 of FIG. 2A and FIG. 2C shows a cross sectional view along Y2-Y2 of FIG. 2A.

Subsequently, a source/drain region of the fin structure 20 not covered by the dummy gate structure 40 is etched down (recessed) to form a source/drain recess 25 in some embodiments. In other embodiments, no recess is formed and the epitaxial layers are formed over the fin structure.

FIGS. 3A-3C show one of the stages of a sequential fabrication process of a semiconductor device according to an embodiment of the present disclosure. FIG. 3A shows a plan (top) view, FIG. 3B shows a cross sectional view along line X1-X1 of FIG. 3A and FIG. 3C shows a cross sectional view along Y2-Y2 of FIG. 3A. In FIG. 3A, the isolation insulating layer 30 is omitted (transparent).

After the source/drain recess 25 is formed, one or more source/drain epitaxial layers 50 are formed in and over the source/drain recess 25. In some embodiments, two or more epitaxial layers having different compositions are formed as the source/drain epitaxial layer 50. In some embodiments, the source/drain epitaxial layer 50 includes SiP or SiCP for an n-type FinFET, and SiGe doped with B for a p-type FinFET. In at least one embodiment, the source/drain epitaxial layers 50 are epitaxially-grown by an LPCVD process, molecular beam epitaxy, atomic layer deposition or any other suitable method. The LPCVD process is performed at a temperature of about 400 to 850° C. and under a pressure of about 1 Torr to 200 Torr, using silicon source gas such as $SiH_4$, $Si_2H_6$, or $Si_3H_8$; germanium source gas such as $GeH_4$, or $G_2H_6$; carbon source gas such as $CH_4$ or $SiH_3CH_3$ and phosphorus source gas such as $PH_3$. In some embodiments, a silicide layer is further formed over the source/drain epitaxial layers 50.

FIGS. 4A-4C show one of the stages of a sequential fabrication process of a semiconductor device according to an embodiment of the present disclosure. FIG. 4A shows a plan (top) view, FIG. 4B shows a cross sectional view along line X1-X1 of FIG. 4A and FIG. 4C shows a cross sectional view along Y2-Y2 of FIG. 4A. In FIG. 4A, some of the layers over the sacrificial gate structures and source/drain epitaxial layers are omitted (transparent).

Then, as shown in FIGS. 4A-4C, an etch stop layer 60 is formed over the source/drain epitaxial layer 50 and the dummy gate structures 40, and then a first interlayer dielectric (ILD) layer 70 is formed over the etch stop layer 60. In some embodiments, the etch stop layer 60 is made of a silicon nitride based material, such as silicon nitride or SiON. The materials for the first ILD layer 70 include compounds comprising Si, O, C and/or H, such as silicon oxide, SiCOH and SiOC. Organic materials, such as polymers, may be used for the first ILD layer 70.

FIGS. 5A-5C show one of the stages of a sequential fabrication process of a semiconductor device according to an embodiment of the present disclosure. FIG. 5A shows a plan (top) view, FIG. 5B shows a cross sectional view along line X1-X1 of FIG. 5A and FIG. 5C shows a cross sectional view along Y2-Y2 of FIG. 5A. In FIG. 5A, some of the layers over the sacrificial gate structures and source/drain epitaxial layers are omitted (transparent).

After the first ILD layer 70 is formed, a planarization operation, such as CMP, is performed, so that the top portion of the dummy gate structures 40 is exposed. Then, the dummy gate structures 40 including the dummy gate electrode layer and the dummy gate dielectric layer are removed, thereby forming gate spaces. The dummy gate structures can be removed using plasma dry etching and/or wet etching. When the dummy gate electrode layer is polysilicon and the first ILD layer 70 is silicon oxide, a wet etchant such as a TMAH solution can be used to selectively remove the dummy gate electrode layer. The dummy gate dielectric layer is thereafter removed using plasma dry etching and/or wet etching.

In the gate spaces, a metal gate structure is formed. The metal gate structure includes a gate dielectric layer 82 and a metal gate electrode 84 as shown in FIG. 5B. In some embodiments, an interfacial layer is formed on the fin structure 20 and a gate dielectric layer 82 is formed on the interfacial layer. In some embodiments, the interfacial layer is formed by chemical oxidation. In some embodiments, the interfacial layer includes one of silicon oxide, silicon nitride and mixed silicon-germanium oxide. The thickness of the interfacial layer is in a range from about 0.2 nm to about 6 nm in some embodiments. In some embodiments, the gate dielectric layer 82 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$ or other suitable high-k dielectric materials, and/or combinations thereof. The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layer. The thickness of the gate dielectric layer 82 is in a range from about 1 nm to about 100 nm in one embodiment.

The metal gate electrode 84 includes one or more conductive layers disposed on the gate dielectric layer 82. In some embodiments, the metal gate electrode layer includes one or more work function adjustment layers. In some embodiments, the work function adjustment layers are made of a conductive material such as a single layer of TiN, WN, TaAlC, TiC, TaAl, TaC, Co, Al, TiAl, or TiAlC, or a multilayer of two or more of these materials. For the n-channel FET, an aluminum containing layer, such as TiAl, TiAlC, TaAl and/or TaAlC is used as an n-type WFM layer, and for the p-channel FET, one or more of TaN, TiN, WN, TiC and/or Co is used as a p-type WFM layer, in some embodiments. The metal gate electrode layer includes one or more body gate electrode layers formed on the work function adjustment layer. In some embodiments, the body gate electrode layer includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

Figure 6A:
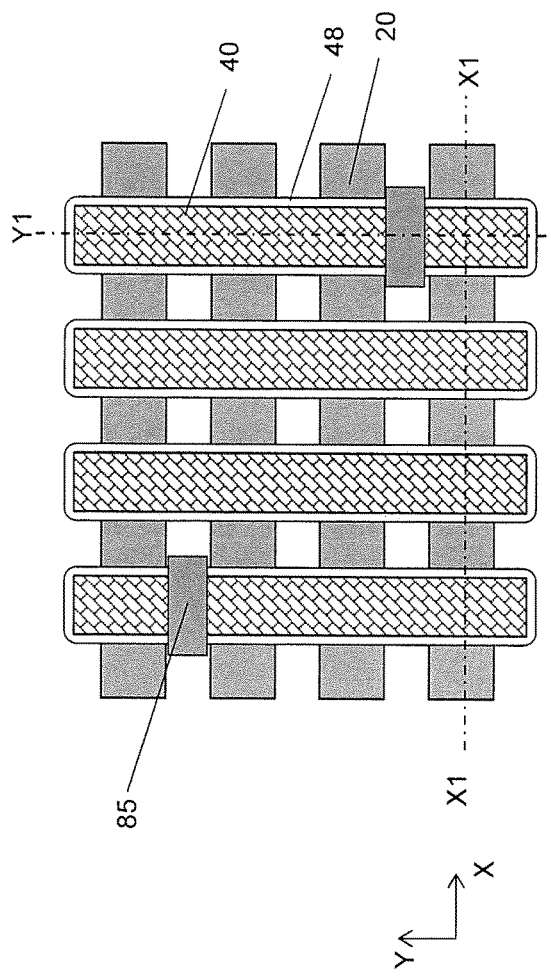
FIGS. 6A, 6B and 6C show a plan view (a top view), a cross sectional view along the X direction and a cross sectional view along the Y direction, respectively, illustrating one of the stages of a sequential semiconductor device fabrication process of according to an embodiment of the present disclosure.
Figure 6C:
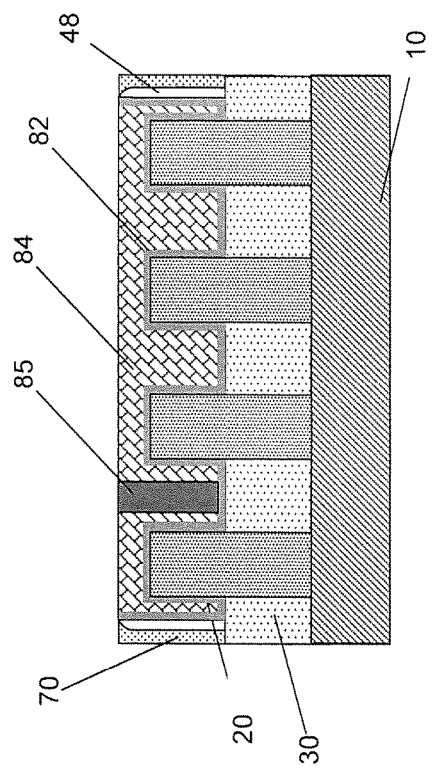
Figure 6B:
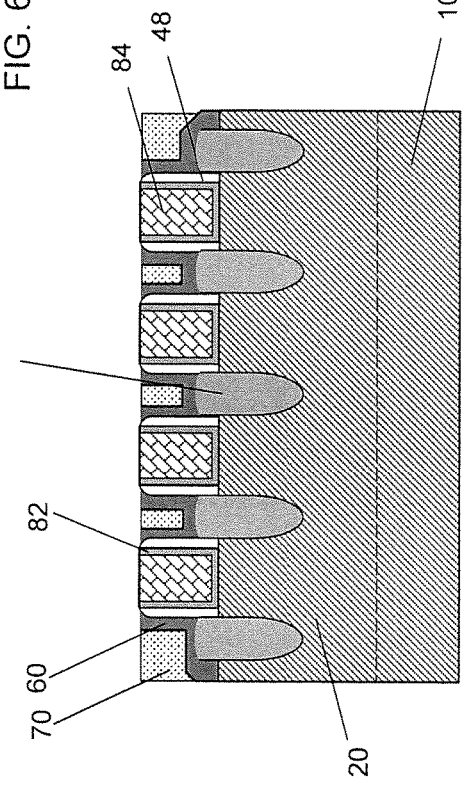

FIGS. 6A-6C show one of the stages of a sequential fabrication process of a semiconductor device according to an embodiment of the present disclosure. FIG. 6A shows a plan (top) view, FIG. 6B shows a cross sectional view along line X1-X1 of FIG. 6A and FIG. 6C shows a cross sectional view along Y1-Y1 of FIG. 6A. In FIG. 6A, some of the layers over the sacrificial gate structures and source/drain epitaxial layers are omitted (transparent).

In some embodiments, after the metal gate structures are formed, the metal gate structures are cut into multiple isolated structures by one or more lithography and etching operations. The adjacent cut metal gate structures are isolated by an insulating plug 85 formed by CVD, ALD or other suitable film formation methods and a planarization operation. In some embodiments, the insulating plug 85 is made of a silicon nitride based material, such as silicon nitride or SiON. In other embodiments, the gate cut operation is performed on the dummy gate structures 40.

FIGS. 7A-7C show one of the stages of a sequential fabrication process of a semiconductor device according to an embodiment of the present disclosure. FIG. 7A shows a plan (top) view, FIG. 7B shows a cross sectional view along line X1-X1 of FIG. 7A and FIG. 7C shows a cross sectional view along Y2-Y2 of FIG. 7A. In FIG. 7A, some of the layers over the sacrificial gate structures and source/drain epitaxial layers are omitted (transparent).

A second ILD layer 75 is formed over the metal gate structures and the first ILD layer, and a mask pattern 87 is formed over the second ILD layer 75. In FIG. 7A, the first and second ILD layers are omitted for explanation purpose. The materials for the second ILD layer 75 is the same as or different from the first ILD layer 70, and include compounds comprising Si, O, C and/or H, such as silicon oxide, SiCOH and SiOC. Organic materials, such as polymers, may be used for the second ILD layer 75.

The mask pattern 87 is formed of a photo resist layer in some embodiments. The photo resist pattern is formed by using a photo mask PM, which is a transmissive type mask or a reflective type mask. In other embodiments, a hard mask layer made of an insulating material or a metallic material is used as the mask pattern 87. The opening portions of the mask pattern 87 define local interconnects.

FIGS. 8A-8C show one of the stages of a sequential fabrication process of a semiconductor device according to an embodiment of the present disclosure. FIG. 8A shows a plan (top) view, FIG. 8B shows a cross sectional view along line X1-X1 of FIG. 8A and FIG. 8C shows a cross sectional view along Y2-Y2 of FIG. 8A. In FIG. 8A, some of the layers over the sacrificial gate structures and source/drain epitaxial layers are omitted (transparent).

The second ILD layer 75, the first ILD layer 70 and the etch stop layer 60 are etched by using one or more etching operations, such as plasma dry etching. By patterning the ILD layers and the etch stop layer, a surface of at least a part of the source/drain epitaxial layers 50 is exposed in openings 89 (e.g., grooves). In some embodiments, the etching operation is performed in a self-aligned manner such that the metal gate structures are not substantially etched. In some embodiments, the metal gate structures include insulating cap layers formed on the body metal gate electrode layers. In some embodiments, the sidewall spacers 48 and the insulating cap layers are made of a silicon nitride-based material (e.g., silicon nitride), while the ILD layer are made of a silicon-oxide-based material (e.g., silicon oxide). Accordingly, during the oxide etching of the ILD layers, the metal gate structures and the sidewall spacers 48 are not substantially etched.

FIGS. 9A-9C show one of the stages of a sequential fabrication process of a semiconductor device according to an embodiment of the present disclosure. FIG. 9A shows a plan (top) view, FIG. 9B shows a cross sectional view along line X1-X1 of FIG. 9A and FIG. 9C shows a cross sectional view along Y2-Y2 of FIG. 9A.

In the opening 89, a conductive material is filled to form a local interconnect 90. One or more layers of metal material, such as tungsten, titanium, cobalt, molybdenum and nickel, or silicide thereof, an alloy thereof or other suitable materials, are formed in the openings 89, and a planarization operation, such as CMP, is performed.

FIGS. 10A-10C show one of the stages of a sequential fabrication process of a semiconductor device according to an embodiment of the present disclosure. FIG. 10A shows a plan (top) view, FIG. 10B shows a cross sectional view along line X1-X1 of FIG. 10A and FIG. 10C shows a cross sectional view along Y2-Y2 of FIG. 10A.

In some embodiments, the conductive layer is further subjected to a planarization operation to partially or fully remove the second ILD layer 75 to form local interconnects 90 as shown in FIGS. 10A-10C.

Figure 10D:
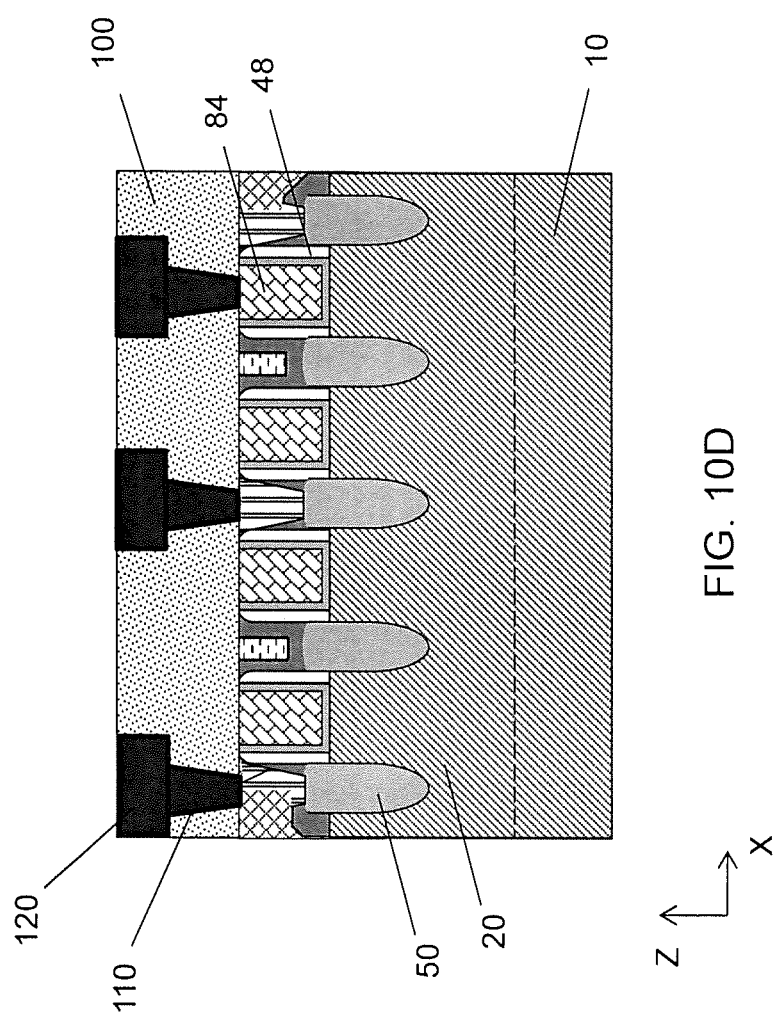
FIG. 10D shows a cross sectional view along the X direction illustrating one of the stages of a sequential semiconductor device fabrication process of according to an embodiment of the present disclosure.

FIG. 10D shows one of the stages of a sequential fabrication process of a semiconductor device according to an embodiment of the present disclosure. FIG. 10D shows a cross sectional view corresponding to line X1-X1 of FIG. 10A.

After the local interconnect 90 is formed, a third ILD layer 100 is formed over the structure of FIGS. 10A-10C. Then, a patterning operation is performed to form via holes, and the via holes are filed with one or more conductive materials so as to form a first via plug 110. A first metal wiring 120 is further formed over the first via plug 110, thereby forming a first metal wiring layer. The first metal wiring 120 and the first via plug 110 can be formed by a dual damascene method. At least one of the first via plugs 110 are connected to the local interconnect 90, and at least one of the first via plugs 110 are connected to the metal gate electrode. Further, one or more metal wiring layers (an ILD layer, via plugs and metal wirings) are formed over the first metal wiring layer.

FIGS. 11A-11CB and 12A-12C show pattern layout (layout design) to form local interconnects according to an embodiment of the present disclosure.

FIGS. 11A-11C show an embodiment of layout patterns for forming local interconnects. As set forth above, the local interconnects 90 are formed between the adjacent gate structures. When designing the layout patterns for the local interconnects, a plurality of line patterns 220 as initial local interconnect patterns are first arranged as shown in FIG. 11A. FIG. 11A further illustrates fin structures 210 (active region patterns) disposed under the local interconnect patterns 220 and via plugs 230 disposed over the local interconnects 220. The cross points of the local interconnect patterns 220 and the active regions patterns 210 correspond to source/drain regions. Although not shown, gate patterns are arranged between the local interconnect patterns 220.

Then, as shown in FIG. 11B, cutting patterns 240 to cut the local interconnect patterns 220 are placed. The cutting patterns 240 correspond to the mask pattern 87 as shown in FIGS. 7A and 8A. After the operations explained with respect to FIGS. 7A-10C, the local interconnect patterns are obtained as shown in FIG. 11C. The local interconnect patterns shown in FIG. 11C include patterns connecting two (or more) active regions 210, patterns on which the via plug patterns 230 are located (active local interconnects), and non-functional patterns other than the active local interconnects. The non-functional patterns may cause an increase of capacitance and degrade device performance. The non-functional local interconnect pattern is a pattern disposed only on one source/drain region and not connected to an upper layer (e.g., via plug) and thus has no electrical function as a part of circuitry. In some embodiments, the non-functional local interconnect pattern is electrically floating. In some embodiments, a pattern disposed on two or more source/drain regions but having no electrical function is part of a non-functional pattern. In some embodiments, an additional patterning operation (lithography and etching operations) is performed to remove the non-functional local interconnect patterns.

FIGS. 12A-12C and FIG. 13 show an embodiment of layout patterns for forming local interconnects according to an embodiment of the present disclosure.

Figure 13:
FIG. 13 shows a flow of sequential semiconductor device fabrication process of according to an embodiment of the present disclosure.

At S101 of FIG. 13, the patterns 210 for active regions, patterns 220 for local interconnects before cutting (initial local interconnect patterns) and patterns 230 for via plugs are generated as shown in FIG. 12A. In some embodiments, the initial local interconnect patterns 220 extend in the Y direction and arranged in the X direction.

At S102 of FIG. 13, initial cutting patterns 240 for cutting initial local interconnect patterns are generated as shown in FIG. 12B. The cut patterns 240 can be generated by one or more Boolean operations of the patterns 210, the patterns 220, the patterns 230 and any other circuit patterns to separate the initial local interconnects into active local interconnects. In some embodiments, the initial cutting patterns 240 are generated based on potentials (voltage) of the local interconnects after cutting (circuit design). The minimum width along the X direction of the initial cutting patterns 240 is greater than the width of the initial local interconnect patterns 220 in some embodiments.

At S103 of FIG. 13, non-functional patterns 245 of the local interconnect patterns are identified by one or more Boolean operations of the patterns 210, the patterns 220, the patterns 230, the patterns 240 and any other circuit patterns.

At S104 of FIG. 13, the identified non-functional patterns 245 and the initial cut patterns 240 are combined to form cutting patterns 250 by, for example, a logical OR operation. In some embodiments, the widths along the X direction of the identified non-functional patterns 245 is adjusted, for example, expanded before combining the non-functional patterns 245 and the initial cut patterns 240. In some embodiments, the widths along the X direction of the identified non-functional patterns 245 are expanded to the minimum width along the X direction of the initial cutting patterns 240. In other embodiments, the widths along the X direction of the identified non-functional patterns 245 are expanded in an amount such that adjacent non-functional patterns 245 become one pattern.

In some embodiments, as shown in FIG. 12B, the cutting patterns 250 include one or more hole (opening) patterns 252.

At S105 of FIG. 13, based on the cutting patterns 250, a photo mask PM (see, FIG. 7B) for defining the locations of the local interconnects is manufactured. The photo mask is a transmission type photo mask for a deep ultra violet (DUV) lithography or a reflective type photo mask for extreme ultra violet (EUV) lithography.

As S106 of FIG. 13, by using the photo mask PM, the mask pattern 87 as shown in FIGS. 7A-7C are formed. In some embodiments, the mask pattern 87 is a photo resist layer subjected to an exposure operation using the photo mask PM and development. In other embodiments, the mask pattern 87 is a hard mask patterned by a photo resist layer subjected to an exposure operation using the photo mask PM and development.

As S107 of FIG. 13, the local interconnects 90 are formed by the operations as explained with respect to FIGS.

8A-10C. The corresponding layout is shown in FIG. 12C. In FIG. 12C, all local interconnects are active and part of functional circuitry. In other words, the semiconductor device do not include any local interconnect that does not function as a part of functional circuitry or that is electrically floating.

In some embodiments, the operations of S101 to S104 are performed by using a mask designing system including one or more CPUs and one or more storages (memories). In some embodiments, the storages store a program, which, when executed by the CPU, causes the CPU to perform the operations of S101-S014.

The foregoing mask formation operations can be applied to form conductive patterns other than the local interconnects.

The various embodiments or examples described herein offer several advantages over the existing art. For example, in the present disclosure, since local interconnects do not include any non-functional patterns, it is possible to reduce capacitance and improve device performance without increasing the process cost.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, initial connection patterns are prepared, initial cutting patterns for cutting the initial connection patterns are prepared, non-functional connection patterns at least from the initial connection patterns are identified, final cutting patterns are prepared from the initial cutting patterns and the non-functional connection patterns, a photo mask is prepared from the final cutting patterns, a photo resist pattern is formed over a target layer by a lithography operation using the photo mask, the target layer is patterned to form openings in the target layer by using the photo resist pattern, and connection layers are formed by filling the openings with a conductive material. In one or more of the foregoing and the following embodiments, the final cutting patterns are prepared by combining the initial cutting patterns and the non-functional connection patterns. In one or more of the foregoing and the following embodiments, in the combining, widths of the non-functional connection patterns are adjusted and then combined with the initial cutting patterns. In one or more of the foregoing and the following embodiments, the widths of the non-functional connection patterns are expanded to a minimum width of the initial cutting patterns. In one or more of the foregoing and the following embodiments, the widths of the non-functional connection patterns are expanded in an amount such that adjacent non-functional connection patterns become one pattern. In one or more of the foregoing and the following embodiments, the connection layers do not include any pattern that does not function as a part of circuitry. In one or more of the foregoing and the following embodiments, the connection layers do not include any pattern that is electrically floating. In one or more of the foregoing and the following embodiments, source/drain regions are formed, and the connection layers include a connection pattern disposed on and connecting at least two source/drain regions. In one or more of the foregoing and the following embodiments, via plugs are formed on the connection layers, and at least one of the via plugs is disposed on one of the connection layers. In one or more of the foregoing and the following embodiments, the final cutting patterns include one or more opening patterns surrounded by a cutting pattern.

In accordance with another aspect of the present disclosure, in a method of manufacturing a semiconductor device, fin structures are formed over a substrate such that upper portions of the fin structures are exposed from an isolation insulating layer disposed over the substrate. Source/drain epitaxial layers are formed over source/drain regions of the fin structures. Gate structures are formed over the upper portions of the fin structures. One or more interlayer dielectric (ILD) layers are formed over the source/drain epitaxial layers and the gate structures. A mask pattern are formed by a lithography operation using a photo mask. The one or more ILD layers are patterned to form openings, in which parts of the source/drain epitaxial layers are exposed, respectively. Connection layers are formed by filling the openings with a conductive material. The photo mask is formed by the following operations. Initial connection patterns are prepared, initial cutting patterns for cutting the initial connection patterns are prepared, non-functional connection patterns are identified at least based on the initial connection patterns, final cutting patterns are prepared from the initial cutting patterns and the non-functional connection patterns, and the photo mask is prepared from the final cutting patterns. In one or more of the foregoing and the following embodiments, the conductive material includes one or more selected from the group consisting of tungsten, titanium, cobalt, molybdenum and nickel, an alloy thereof and a silicide thereof. In one or more of the foregoing and the following embodiments, the connection layers include a connection pattern disposed on and connecting at least two source/drain epitaxial layers. In one or more of the foregoing and the following embodiments, an additional ILD layer is formed, add via plugs are formed in the additional ILD layer. At least one of the via plugs is disposed on one of the connection layers. In one or more of the foregoing and the following embodiments, the connection layers include no pattern that does not connect the source/drain epitaxial layer or are not connected to any via plug.

In accordance with another aspect of the present disclosure, in a method of manufacturing a photo mask, initial connection patterns are prepared, initial cutting patterns for cutting the initial connection patterns are prepared, non-functional connection patterns are identified at least based on the initial connection patterns, final cutting patterns are prepared from the initial cutting patterns and the non-functional connection patterns, and a photo mask is prepared from the final cutting patterns. In one or more of the foregoing and the following embodiments, the final cutting patterns are prepared by combining the initial cutting patterns and the non-functional connection patterns. In one or more of the foregoing and the following embodiments, in the combining, widths of the non-functional connection patterns are adjusted and then combined with the initial cutting patterns. In one or more of the foregoing and the following embodiments, the widths of the non-functional connection patterns are expanded to a minimum width of the initial cutting patterns. In one or more of the foregoing and the following embodiments, the widths of the non-functional connection patterns are expanded in an amount such that adjacent non-functional connection patterns become one pattern.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming fin structures over a substrate such that upper portions of the fin structures are exposed from an isolation insulating layer disposed over the substrate;
    forming source/drain epitaxial layers over source/drain regions of the fin structures;
    forming gate structures over the upper portions of the fin structures;
    forming one or more interlayer dielectric layers over the source/drain epitaxial layers and the gate structures;
    forming a mask pattern by a lithography operation using a photo mask;
    patterning the one or more interlayer dielectric (ILD) layers to form openings, in which parts of the source/drain epitaxial layers are exposed, respectively; and
    forming connection layers by filling the openings with a conductive material,
    wherein the photo mask is formed by:
        preparing initial connection patterns;
        preparing initial cutting patterns for cutting the initial connection patterns;
        identifying non-functional connection patterns at least from the initial connection patterns;
        preparing final cutting patterns from the initial cutting patterns and the non-functional connection patterns;
        preparing the photo mask from the final cutting patterns.

2. The method of claim 1, wherein the conductive material includes one or more selected from the group consisting of tungsten, titanium, cobalt, molybdenum and nickel, an alloy thereof and a silicide thereof.

3. The method of claim 1, wherein the connection layers include a connection pattern disposed on and connecting at least two source/drain epitaxial layers.

4. The method of claim 1, further comprising:
    forming an additional ILD layer; and
    forming via plugs in the additional ILD layer,
    wherein at least one of the via plugs is disposed on one of the connection layers.

5. The method of claim 4, wherein the connection layers do not include any pattern that does not connect the source/drain epitaxial layer or are not connected to any via plug.

6. A method of manufacturing a photo mask, the method comprising:
    preparing initial connection patterns;
    preparing initial cutting patterns for cutting the initial connection patterns;
    identifying non-functional connection patterns at least from the initial connection patterns;
    preparing final cutting patterns from the initial cutting patterns and the non-functional connection patterns; and
    preparing the photo mask from the final cutting patterns.

7. The method of claim 6, wherein the final cutting patterns are prepared by combining the initial cutting patterns and the non-functional connection patterns.

8. The method of claim 7, wherein in the combining, widths of the non-functional connection patterns are adjusted and then combined with the initial cutting patterns.

9. The method of claim 8, wherein the widths of the non-functional connection patterns are expanded to a minimum width of the initial cutting patterns.

10. The method of claim 8, wherein the widths of the non-functional connection patterns are expanded in an amount such that adjacent non-functional connection patterns become one pattern.

11. A method of manufacturing a semiconductor device, the method comprising:
    forming an underlying structure including source/drain epitaxial layers;
    forming a interlayer dielectric (ILD) layer over the underlying structure;
    forming a mask pattern by a lithography operation using a photo mask;
    patterning the ILD layer to form openings, in which parts of the source/drain epitaxial layers are exposed, respectively; and
    forming connection layers by filling the openings with a conductive material, wherein the photo mask is formed by:
    preparing initial connection layout patterns;
    preparing initial cutting layout patterns for cutting the initial connection layout patterns;
    identifying non-functional connection layout patterns at least from the initial connection layout patterns, and preparing final cutting layout patterns from the initial cutting layout patterns and the non-functional connection layout patterns; and
    manufacturing the photo mask from the final cutting layout patterns.

12. The method of claim 11, wherein the final cutting layout patterns are prepared by combining the initial cutting layout patterns and the non-functional connection layout patterns.

13. The method of claim 12, wherein in the combining, widths of the non-functional connection layout patterns are adjusted and then combined with the initial cutting layout patterns.

14. The method of claim 13, wherein the widths of the non-functional connection layout patterns are expanded to a minimum width of the initial cutting layout patterns.

15. The method of claim 13, wherein the widths of the non-functional connection layout patterns are expanded in an amount such that adjacent non-functional connection layout patterns become one pattern.

16. The method of claim 11, wherein the connection layers do not include any pattern that does not function as a part of circuitry.

17. The method of claim 11, wherein the connection layers do not include any pattern that is electrically floating.

18. The method of claim 11, wherein:
    the underlying structure further includes source/drain regions on which the source/drain epitaxial layers are formed, and
    the connection layers include a connection pattern disposed on and connecting at least two source/drain regions.

19. The method of claim 11, further comprising:
    forming via plugs on the connection layers,
    wherein at least one of the via plugs is disposed on one of the connection layers.

20. The method of claim 11, wherein the final cutting layout patterns include one or more opening patterns surrounded by a cutting layout pattern.

* * * * *